(12) United States Patent
Saito

(10) Patent No.: US 11,841,269 B2
(45) Date of Patent: Dec. 12, 2023

(54) ELECTRONIC APPARATUS AND SPECTROSCOPIC CAMERA

(71) Applicant: SEIKO EPSON CORPORATION, Tokyo (JP)

(72) Inventor: Daisuke Saito, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 156 days.

(21) Appl. No.: 17/469,637

(22) Filed: Sep. 8, 2021

(65) Prior Publication Data

US 2022/0082438 A1 Mar. 17, 2022

(30) Foreign Application Priority Data

Sep. 16, 2020 (JP) .................... 2020-155380

(51) Int. Cl.
*G01J 3/28* (2006.01)
*G01J 3/02* (2006.01)
*H05K 1/18* (2006.01)
*G01J 3/12* (2006.01)

(52) U.S. Cl.
CPC ........... *G01J 3/2823* (2013.01); *G01J 3/0291* (2013.01); *H05K 1/183* (2013.01); *G01J 2003/1226* (2013.01); *H05K 2201/10151* (2013.01)

(58) Field of Classification Search
CPC .............. G01J 3/2823; G01J 3/0291; G01J 2003/1226; G01J 3/26; H05K 1/183; H05K 2201/10151; H05K 9/0064; H05K 2201/10189; H05K 1/0215
See application file for complete search history.

(56) References Cited

U.S. PATENT DOCUMENTS

| 4,737,597 | A | * | 4/1988 | Tomiya | ............... | H05K 9/0039 |
| | | | | | | 174/376 |
| 5,414,492 | A | * | 5/1995 | Kubota | .................. | G03G 15/80 |
| | | | | | | 399/130 |
| 5,701,155 | A | * | 12/1997 | Wood | ....................... | A61B 1/04 |
| | | | | | | 348/75 |
| 6,409,347 | B1 | | 6/2002 | Kuroda et al. | | |

(Continued)

FOREIGN PATENT DOCUMENTS

| JP | H11354945 A | 12/1999 |
| JP | 2005341175 A | 12/2005 |

*Primary Examiner* — Abdullahi Nur
(74) *Attorney, Agent, or Firm* — CHIP LAW GROUP

(57) ABSTRACT

A spectroscopic camera includes: a variable-wavelength interference filter; an image pickup element receiving light outputted from the variable-wavelength interference filter; a first circuit board where the variable-wavelength interference filter is provided; a second circuit board where the image pickup element is provided; a casing accommodating the first circuit board and the second circuit board; a first connector mounted at the first circuit board and provided with a first FG terminal electrically coupled to an external device; and a second connector mounted at the second circuit board and provided with a second FG terminal electrically coupled to the external device. The casing is electrically coupled to the first FG terminal of the first connector and the second FG terminal of the second connector without going through the first circuit board and the second circuit board, respectively.

6 Claims, 5 Drawing Sheets

(56) References Cited

U.S. PATENT DOCUMENTS

| | | | |
|---|---|---|---|
| 6,728,110 B2 * | 4/2004 | Koyama | H05K 5/0073 |
| | | | 361/752 |
| 2007/0064119 A1 | 3/2007 | Komiya et al. | |
| 2008/0267617 A1 * | 10/2008 | Huang | G03B 17/02 |
| | | | 396/542 |

* cited by examiner

… (1)

ELECTRONIC APPARATUS AND SPECTROSCOPIC CAMERA

The present application is based on, and claims priority from JP Application Serial Number 2020-155380, filed Sep. 16, 2020, the disclosure of which is hereby incorporated by reference herein in its entirety.

BACKGROUND

1. Technical Field

The present disclosure relates to an electronic apparatus and a spectroscopic camera.

2. Related Art

According to the related art, in an electronic apparatus having a circuit board with an electronic component mounted thereat and a casing accommodating the circuit board, the circuit board and the casing are electrically coupled together to make the casing form a frame ground. In such an electronic apparatus, a noise current generated in the circuit board due to electromagnetic waves flows to the casing. Therefore, the operation of the electronic components can be stabilized, for example, as described in JP-A-11-354945.

Recently, an industrial electronic apparatus needs to have a higher level of resistance to electromagnetic waves, that is, a higher level of ability (immunity) to operate stably when obstructed by a noise current or the like due to electromagnetic waves. However, the electrically coupled structure between the circuit board and the casing as described above is not sufficient as a measure to improve the immunity of the electronic apparatus. Thus, whether or not the immunity of the electronic apparatus can be improved to a sufficient level depends on the performance of the electronic apparatus itself and therefore only limited types of electronic components can be used.

In a spectroscopic camera having a spectroscopic element and an image pickup element as electronic components, electromagnetic waves radiated from an image pickup element substrate enter a spectroscopic element substrate, making the operation of the spectroscopic element unstable and thus making the wavelength of light outputted from the spectroscopic element unstable. Therefore, a measure to improve the immunity of the spectroscopic camera is demanded.

SUMMARY

An electronic apparatus according to a first aspect of the disclosure includes: a circuit board at which an electronic component performing predetermined processing is mounted; a casing accommodating the circuit board; and a connector mounted at the circuit board and provided with a frame ground terminal electrically coupled to an external device. The casing is electrically coupled to the frame ground terminal of the connector without going through the circuit board.

A spectroscopic camera according to a second aspect of the disclosure includes: a spectroscopic element spectrally separating and outputting light having a predetermined wavelength corresponding to an inputted drive voltage from incident light; an image pickup element picking up an image of the light outputted from the spectroscopic element; a first circuit board having the spectroscopic element mounted thereat; a second circuit board having the image pickup element mounted thereat; a casing accommodating the first circuit board and the second circuit board; a first connector mounted at the first circuit board and provided with a first frame ground terminal electrically coupled to an external device; and a second connector mounted at the second circuit board and provided with a second frame ground terminal electrically coupled to the external device. The casing is electrically coupled to the first frame ground terminal and the second frame ground terminal without going through the first circuit board and the second circuit board, respectively.

DESCRIPTION OF EXEMPLARY EMBODIMENTS

An embodiment will now be described.
Configuration of Spectroscopic Camera 1

Figure 1:
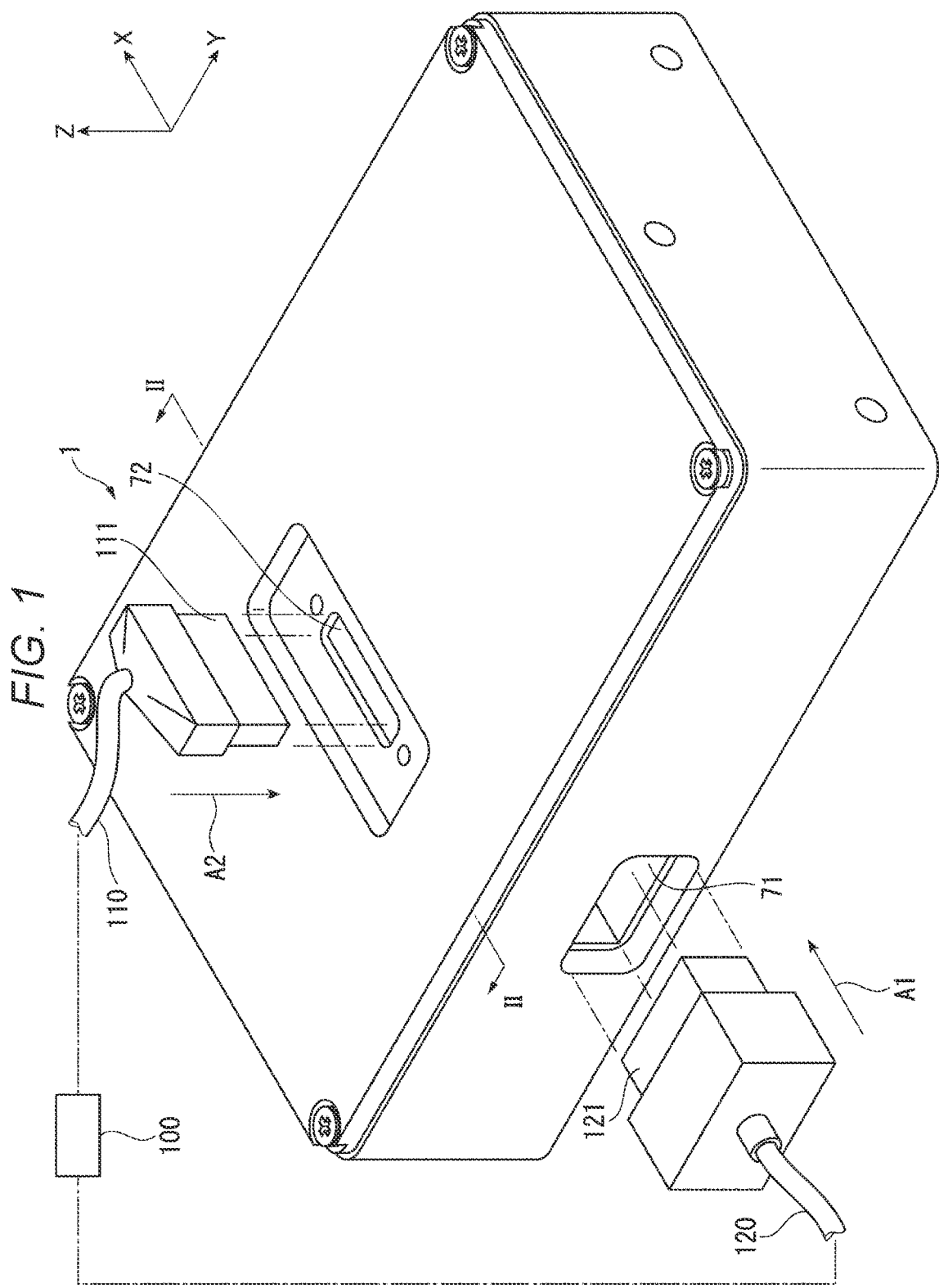
FIG. 1 is a schematic view showing an external appearance of a spectroscopic camera according to an embodiment of the disclosure.
Figure 2:
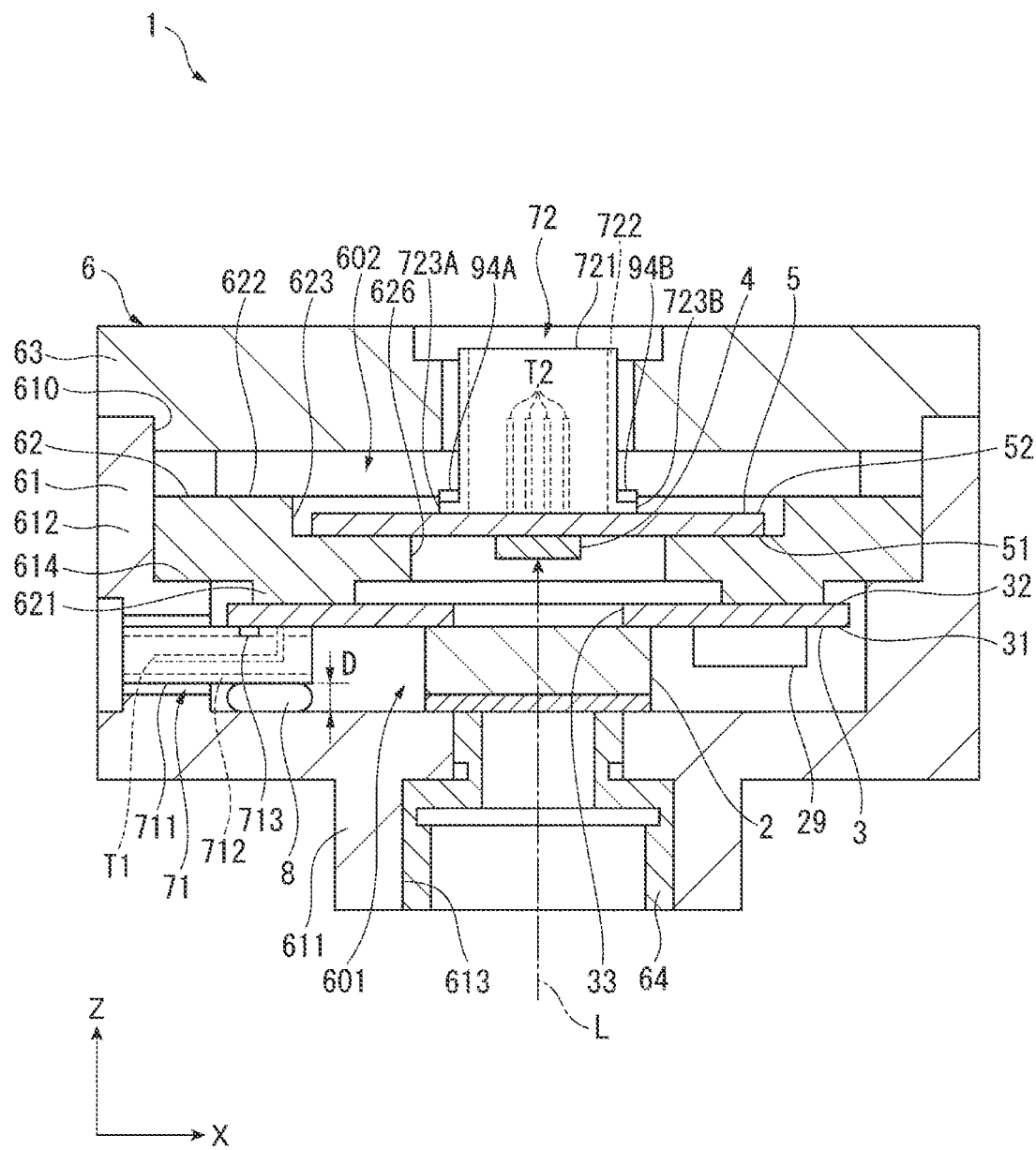
FIG. 2 is cross-sectional view taken along an arrow line II-II in FIG. 1.

FIG. 1 is a perspective view showing an external appearance of a spectroscopic camera 1 which is an optical device according to this embodiment. FIG. 2 is a cross-sectional view taken along an arrow line II-II in FIG. 1 and schematically showing the structure of the spectroscopic camera 1.

As shown in FIG. 1, the spectroscopic camera 1 according to this embodiment is an image pickup device coupled to a controller 100, which is an external device, via a first cable 110 and a second cable 120, and being controlled by the controller 100 to pick up a spectroscopic image of an image pickup target. As shown in FIG. 2, the spectroscopic camera 1 has a spectroscopic module 2, a first circuit board 3 having the spectroscopic module 2 mounted thereat, an image pickup element 4 receiving light transmitted through the spectroscopic module 2 and picking up an image, a second circuit board 5 having the image pickup element 4 mounted thereat, and a casing 6 accommodating these parts.

In the description below, a direction parallel to the optical axis of the image pickup element 4 is defined as a Z-direction. Two directions orthogonal to the Z-direction are defined as an X-direction and a Y-direction. A direction toward the image pickup element 4 from the spectroscopic module 2 along the Z-direction, that is, a light travelling direction L of incident light, is defined as a +Z-direction.
Configuration of Spectroscopic Module 2 and First Circuit Board 3

Figure 3:
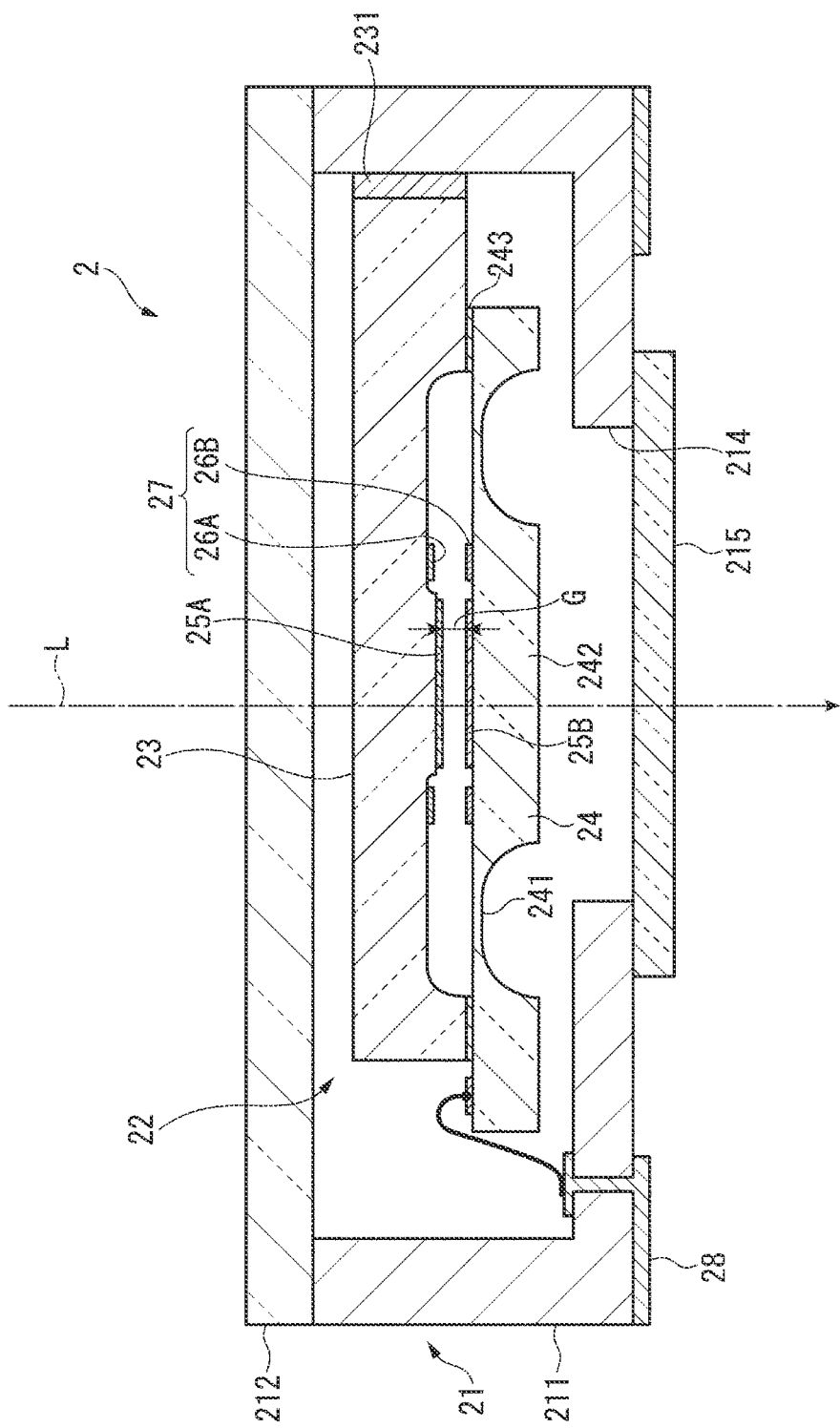
FIG. 3 is a cross-sectional view showing a variable-wavelength interference filter of the spectroscopic camera.

FIG. 3 is a cross-sectional view showing the spectroscopic module 2 in this embodiment. The configuration of the spectroscopic module 2 is similar to that of the related art and therefore will be briefly described below.

The spectroscopic module 2 has a module casing 21 and a variable-wavelength interference filter 22 accommodated inside the module casing 21.

The module casing 21 has, for example, a container-like case member 211, a light-transmissive substrate 212 closing a container opening of the case member 211, and a light-transmissive plate 215 closing a hole 214 formed in a bottom part of the case member 211. The air pressure in the internal space of the module casing 21 is preferably reduced to lower than atmospheric pressure.

The variable-wavelength interference filter 22 in this embodiment is a so-called Fabry-Perot etalon element and is equivalent to the spectroscopic element according to the disclosure. The variable-wavelength interference filter 22 has a first filter substrate 23 and a second filter substrate 24 arranged opposite each other. The first filter substrate 23 is supported by the module casing 21 via an adhesive layer 231. The second filter substrate 24 is provided with an annular diaphragm part 241. A part of the second filter substrate 24 surrounded by the diaphragm part 241 is a moving part 242. The second filter substrate 24 is supported by the first filter substrate 23 via an adhesive layer 243 provided outside the diaphragm part 241.

The first filter substrate 23 is provided with a mirror 25A and an electrode 26A. The moving part 242 of the second filter substrate 24 is provided with a mirror 25B and an electrode 26B.

The mirrors 25A, 25B are formed of a metal film, a dielectric multilayer film or the like and are arranged opposite each other via a gap G.

The electrodes 26A, 26B are arranged opposite each other around the mirrors 25A, 25B and form an electrostatic actuator 27. The electrodes 26A, 26B are coupled to the first circuit board 3 (see FIG. 2) via a terminal part 28 provided at the module casing 21.

In the variable-wavelength interference filter 22, when a drive voltage is applied to the electrostatic actuator 27, the diaphragm part 241 flexes and the moving part 242 moves, thus changing the dimension of the gap G. The variable-wavelength interference filter 22 can transmit light having a wavelength corresponding to the dimension of the gap G.

That is, the variable-wavelength interference filter 22 spectrally separates and outputs light having a wavelength corresponding to the inputted drive voltage from incident light.

As shown in FIG. 2, the spectroscopic module 2, a spectroscopic driver circuit 29 performing drive control on the spectroscopic module 2, and a first connector 71 to which a wiring extending from the spectroscopic driver circuit 29 is coupled, are mounted at the first circuit board 3. In FIG. 2, the spectroscopic module 2, the spectroscopic driver circuit 29, and the first connector 71 are each mounted at a first surface 31 facing the −Z-direction, of the first circuit board 3. However, these may be mounted at a second surface 32 opposite to the first surface 31.

The first circuit board 3 is also provided with a hole 33 through which light transmitted through the spectroscopic module 2 passes.

The first circuit board 3 can communicate with the controller 100 (see FIG. 1), which is an external device, via the first connector 71. For example, based on a control signal inputted from the controller 100, the spectroscopic driver circuit 29 performs drive control on the variable-wavelength interference filter 22 of the spectroscopic module 2.

Configuration of Image Pickup Element 4 and Second Circuit Board 5

As shown in FIG. 2, the image pickup element 4 is an image pickup element that receives light incident on the spectroscopic camera 1 and outputs a signal corresponding to the amount of light received. The image pickup element 4 in this embodiment is, for example, a CMOS (complementary metal-oxide-semiconductor) or a CCD (charge-coupled device). The image pickup element 4 has a plurality of pixels arranged in a matrix along the X- and Y-directions and receives light at each pixel to pick up an image.

The image pickup element 4, an image pickup driver circuit 41 (see FIG. 4) performing drive control on the image pickup element 4, and a second connector 72 to which a wiring extending from the image pickup element 4 is coupled, are mounted at the second circuit board 5. Specifically, the image pickup element 4 is mounted at a first surface 51 facing the −Z-direction, of the second circuit board 5. The image pickup driver circuit 41 and the second connector 72 are mounted at a second surface 52 facing the +Z-direction, of the second circuit board 5.

The second circuit board 5 can communicate with the controller 100 (see FIG. 1), which is an external device, via the second connector 72. For example, based on a control signal inputted from the controller 100, the image pickup driver circuit 41 performs drive control on the image pickup element 4.

Configuration of Casing 6

As shown in FIG. 2, the casing 6 has a case member 61, a substrate support member 62 accommodated in the case member 61, and a lid member 63 covering an opening 610 of the case member 61.

Each member forming the casing 6 is formed, for example, by an electrically conductive member made of a metal, an electrically conductive resin or the like and is maintained at a common reference potential (ground potential).

The case member 61 has a bottom part 611 and a sidewall part 612.

The bottom part 611 is provided with a light incident window 613 through which light is transmitted between an inside and an outside the casing 6. A lens holder 64 is installed in the light incident window 613. The lens holder 64 holds at least one or more lenses (not illustrated) guiding incident light to the spectroscopic module 2.

The sidewall part 612 is provided with a step part 614 for holding the substrate support member 62.

The substrate support member 62 is accommodated in the case member 61, is supported by the step part 614 in the sidewall part 612 of the case member 61, and is fixed to the case member 61 with a screw or the like.

The substrate support member 62 also has a first support part 621 supporting the first circuit board 3 into the −Z-direction and a second support part 622 supporting the second circuit board 5 into the +Z-direction.

The substrate support member 62 is also provided with a penetration hole 626 through which light heading toward the image pickup element 4 from the spectroscopic module 2 is transmitted.

The first circuit board 3 is arranged parallel to the first support part 621 along the X- and Y-directions and is fixed to the first support part 621 with a screw or the like. Similarly, the second circuit board 5 is arranged parallel to the second support part 622 along the X- and Y-directions and is fixed to the second support part 622 with a screw or the like.

The substrate support member 62 is electrically coupled to a frame ground (GND) of the first circuit board 3 via the screw or the like fixing the first circuit board 3. The substrate support member 62 is also electrically coupled to a frame ground (GND) of the second circuit board 5 via the screw or the like fixing the second circuit board 5.

The lid member 63 is a member covering the opening 610 of the case member 61. The lid member 63 is fixed to an edge part around the opening 610 of the case member 61 with a screw or the like.

In the casing 6 as described above, a first accommodation space 601 where the first circuit board 3 or the like is arranged is formed between the substrate support member 62 and the bottom part 611 of the case member 61, and a second accommodation space 602 where the second circuit board 5 or the like is arranged is formed between the substrate support member 62 and the lid member 63.

Configuration of First Connector and Second Connector

The spectroscopic camera 1 according to this embodiment has the first connector 71 for communicably coupling together the first circuit board 3 and the controller 100, which is an external device, and the second connector 72 for communicably coupling the second circuit board 5 and the controller 100 together, as described above (see FIG. 1).

Each of the first connector 71 and the second connector 72 in this embodiment is a connector corresponding to an arbitrary USB (Universal Serial Bus) standard, that is, a USB terminal. Each of the first connector 71 and the second connector 72 in this embodiment is a receptacle terminal. The basic configuration of the first connector 71 and the second connector 72 is similar to that of the related art and therefore will briefly described below.

First Connector 71

As shown in FIG. 2, the first connector 71 has a connector shell 711 formed of an electrically conductive material, and a plurality of terminals T1.

The connector shell 711 has a cylindrical connector shell main body 712 accommodating the plurality of terminals T1, and a plurality of attachment pieces 713 protruding outward from the connector shell main body 712. The attachment pieces 713 protrude in a direction substantially parallel to the XY-plane from the connector shell main body 712 and are soldered to the first circuit board 3.

The plurality of terminals T1 include, for example, an SG terminal for a signal ground line, an FG terminal (frame ground terminal) for a frame ground line, a Vbus terminal for a power supply line, and a D+ terminal and a D− terminal for a differential signal line. Of these terminals, the SG terminal, the Vbus terminal, the D+ terminal, and the D− terminal are coupled to respective wirings on the first circuit board 3. The FG terminal is coupled to the connector shell 711.

Hereinafter, the FG terminal of the first connector 71 is referred to as first FG terminal (first frame ground terminal). In FIG. 2, the illustration of the plurality of terminals T1 is simplified.

The first connector 71 is arranged in such a way that the axial direction of the connector shell main body 712 is laid along the first surface 31 of the first circuit board 3, that is, substantially parallel to the XY-plane.

A plug part 111 of the first cable 110 is coupled to the first connector 71 along a coupling direction A1 substantially parallel to the XY-plane (see FIG. 1). The plug part 111 is inserted into the connector shell main body 712 and thus electrically coupled to each of the plurality of terminals T1. That is, the plurality of terminals T1 including the first FG terminal are electrically coupled to the controller 100 via the first cable 110.

Second Connector 72

The second connector 72 has a configuration substantially similar to that of the first connector 71.

That is, as shown in FIG. 2, the second connector 72 has a connector shell 721 formed of an electrically conductive material, and a plurality of terminals T2.

The connector shell 721 has a cylindrical connector shell main body 722 accommodating the plurality of terminals T2, and attachment pieces 723A, 723B protruding outward from the connector shell main body 722. The attachment pieces 723A, 723B protrude to both sides along the X-direction from the connector shell main body 722 and are soldered to the second circuit board 5.

The plurality of terminals T2 include, for example, an SG terminal for a signal ground line, an FG terminal for a frame ground line, a Vbus terminal for a power supply line, and a D+ terminal and a D− terminal for a differential signal line. Of these terminals, the SG terminal, the Vbus terminal, the D+ terminal, and the D− terminal are coupled to respective wirings on the second circuit board 5. The FG terminal is electrically coupled to the connector shell 721.

Hereinafter, the FG terminal of the second connector 72 is referred to as second FG terminal (second frame ground terminal). In FIG. 2, the illustration of the plurality of terminals T2 is simplified.

The second connector 72 is arranged in such a way that the axial direction of the connector shell main body 722 is orthogonal to the second circuit board 5, that is, substantially parallel to the Z-direction.

A plug part 121 of the second cable 120 is coupled to the second connector 72 along a coupling direction A2 substantially parallel to the Z-direction (see FIG. 1). The plug part 121 is inserted into the connector shell main body 722 and thus electrically coupled to each of the plurality of terminals T2. That is, the plurality of terminals T2 including the second FG terminal are electrically coupled to the controller 100 via the second cable 120.

Elastic Member 8

The spectroscopic camera 1 according to this embodiment also has an elastic member 8 for electrically coupling the casing 6 and the first connector 71 together, as shown in FIG. 2. The elastic member 8 is electrically conductive at least on the surface thereof. For example, a soft gasket can be used as the elastic member 8.

The first connector 71 is provided at the first surface 31 of the first circuit board 3 opposite the bottom part 611 of the case member 61 and is arranged in such a way that the lateral surface of the connector shell main body 712 faces the bottom part 611 of the case member 61. The elastic member 8 is held between the bottom part 611 of the case member 61 and the lateral surface of the connector shell main body 712 of the first connector 71 and thus electrically couples the casing 6 and the first connector 71 together.

A gap D in the Z-direction between the connector shell main body 712 and the lid member 63 is smaller than the thickness of the elastic member 8 in a no-load state before the manufacture of the spectroscopic camera 1. Therefore, assembling the spectroscopic camera 1 while pressing the elastic member 8 between the connector shell main body 712 and the lid member 63 enables secure coupling between the connector shell main body 712 and the lid member 63 via the elastic member 8.

As described above, in the first connector 71, the first FG terminal is coupled to the connector shell 711. Therefore, the casing 6 is electrically coupled to the first FG terminal of the first connector 71 via the elastic member 8 and the connector shell 711.

Plate Member 9

Figure 4:
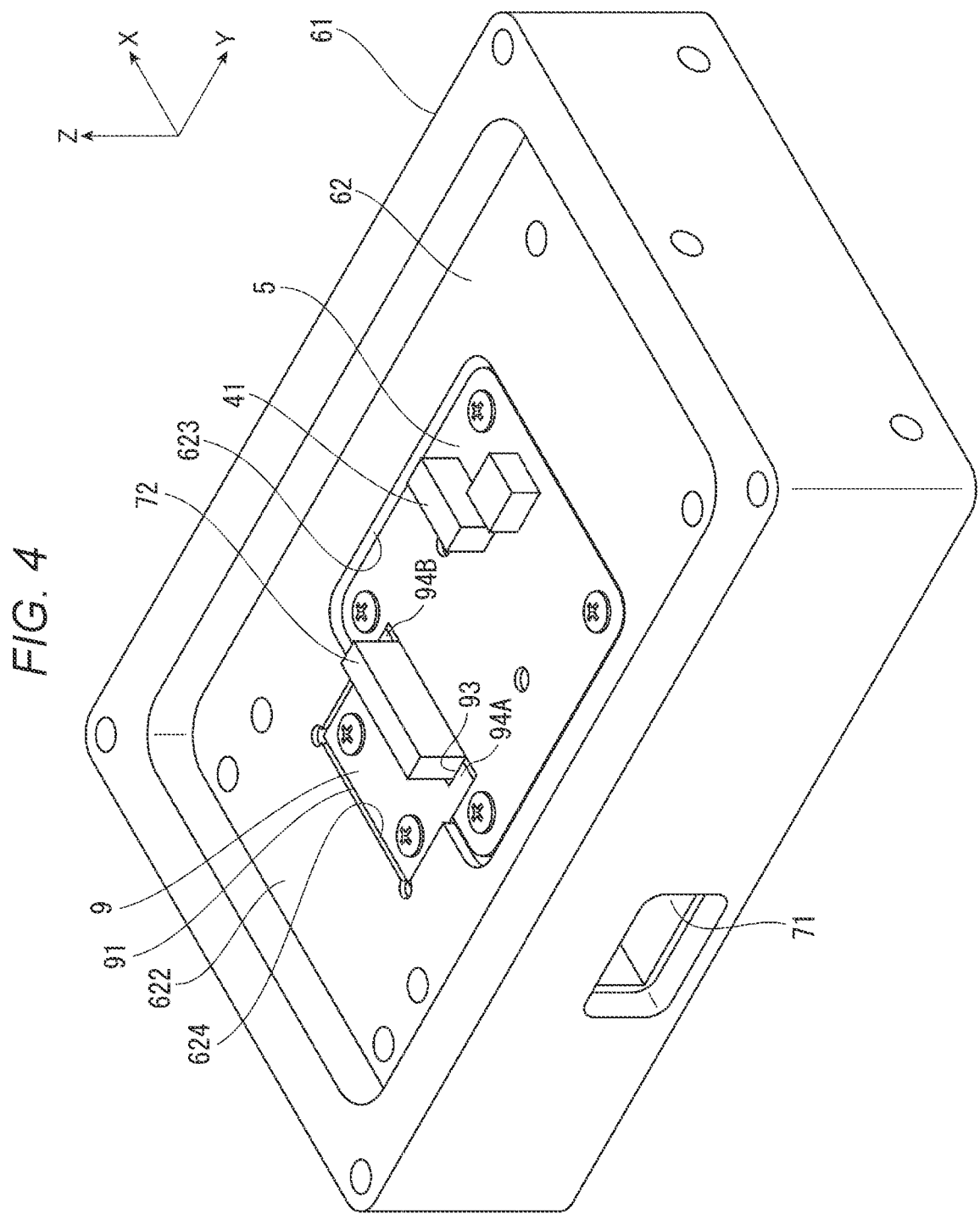
FIG. 4 is a perspective view omitting a part of a casing of the spectroscopic camera.
Figure 5:
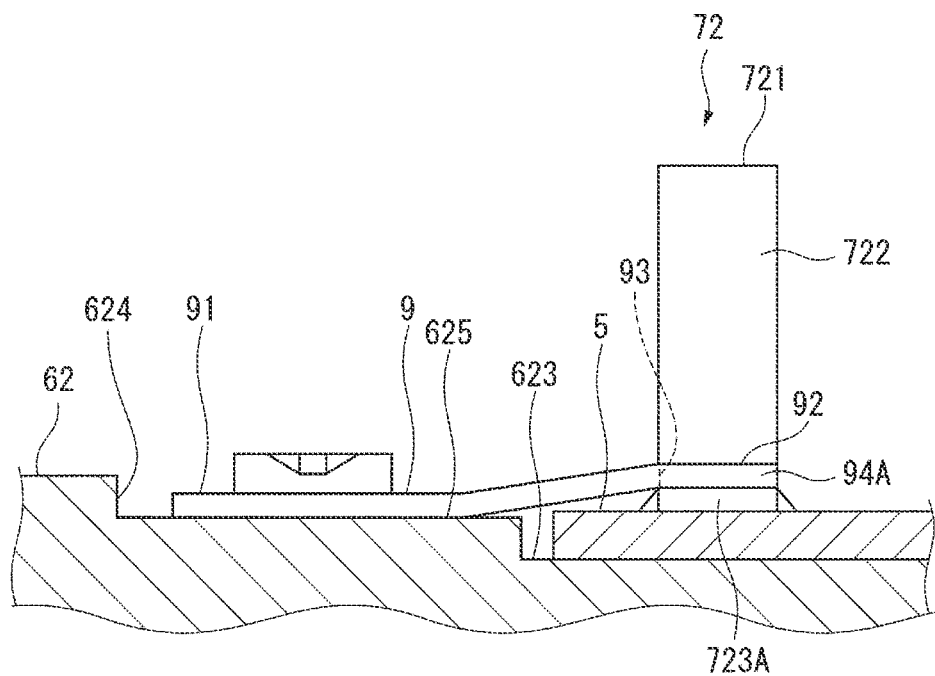
FIG. 5 is an enlarged cross-sectional view showing a peripheral part of a second connector in the spectroscopic camera.

The spectroscopic camera 1 according to this embodiment also has a plate member 9 for electrically coupling the casing 6 and the second connector 72 together, as shown in FIGS. 4 and 5. FIG. 4 is a perspective view showing the spectroscopic camera 1 in the state where the lid member of the casing is omitted. FIG. 5 is a partial cross-sectional view showing a peripheral structure of the plate member 9.

The plate member 9 is electrically conductive at least on the surface thereof. For example, a metal plate member can be used as the plate member 9. The plate member 9 is supported by the second support part 622 of the substrate support member 62, similarly to the second circuit board 5.

Specifically, in this embodiment, a first recess part 623 where the second circuit board 5 is arranged, and a second recess part 624 where a one-end part 91 of the plate member 9 is attached, are formed at the second support part 622. The plate member 9 is arranged substantially parallel to the XY-plane. The one-end part 91 in the Y-direction of the plate member 9 is fixed to a bottom surface 625 of the second recess part 624 with a screw or the like. An other-end part 92 in the Y-direct ion of the plate member 9 extends toward the second circuit board 5. The other-end part 92 of the plate member 9 is provided with a rectangular slit 93. Therefore, the other-end part 92 of the plate member 9 has contact pieces 94A, 94B arranged on both sides of the slit 93 in the X-direction.

In the slit 93 of the plate member 9, the connector shell main body 722 of the second connector 72 is arranged. The contact pieces 94A, 94B of the plate member 9 are in contact with the attachment pieces 723A, 723B of the second connector 72, respectively.

As shown in FIG. 5, the bottom surface 625 of the second recess part 624 is located more in the −Z-direction than the upper surface of the attachment piece 723A of the second connector 72. In FIG. 5, the attachment piece 723A, which is one of the attachment pieces 723A, 723B, is illustrated. However, the upper surfaces of the attachment pieces 723A, 723B are at the same position in the Z-direction.

Thus, the contact pieces 94A, 94B of the plate member 9 are electrically in contact with the upper surfaces of the attachment pieces 723A, 723B of the second connector 72.

As described above, in the second connector 72, the second FG terminal is coupled to the connector shell 721. Therefore, the casing 6 is electrically coupled to the second FG terminal via the plate member 9 and the connector shell 721.

Advantageous Effects of this Embodiment

The spectroscopic camera 1 according to this embodiment includes: the variable-wavelength interference filter 22 (spectroscopic element) spectrally separating and outputting light having a predetermined wavelength corresponding to an inputted drive voltage from incident light; the image pickup element 4 receiving the light outputted from the variable-wavelength interference filter 22; the first circuit board 3, where the variable-wavelength interference filter 22 is provided; the second circuit board 5, where the image pickup element 4 is provided; the casing 6 accommodating the first circuit board 3 and the second circuit board 5; the first connector 71 mounted at the first circuit board 3; and the second connector 72 mounted at the second circuit board 5. The first connector 71 is provided with the first FG terminal electrically coupled to the controller 100. The second connector 72 is provided with the second FG terminal electrically coupled to the controller 100. The casing 6 is electrically coupled to the first FG terminal of the first connector 71 and the second FG terminal of the second connector 72 without going through the first circuit board 3 and the second circuit board 5.

In such a configuration, a noise current generated in the casing 6 or the first circuit board 3 flows from the casing 6 to the first FG terminal of the first connector 71. The noise current then flows to the grounding part of the controller 100 via the frame ground line of the first cable 110 coupled to the first FG terminal.

Also, a noise current generated in the casing 6 or the second circuit board 5 flows from the casing 6 to the second FG terminal of the second connector 72. The noise current then flows to the grounding part of the controller 100 via the frame ground line of the second cable 120 coupled to the second FG terminal.

That is, a noise current generated in the casing 6, the first circuit board 3 or the second circuit board 5 in this embodiment flows from the casing 6 to the first connector 71 or the second connector 72 without going through the first circuit board 3 and the second circuit board 5 and is eliminated by the grounding of the controller 100. Therefore, in this embodiment, the operation of the variable-wavelength interference filter 22 and the operation of the image pickup element 4 can be stabilized.

Thus, the spectroscopic camera 1 according to this embodiment can achieve a sufficient level of immunity as an industrial electronic apparatus. Also, the range of types of electronic components that can be used as electronic components forming the spectroscopic camera 1, such as the spectroscopic module 2 and the image pickup element 4, can be expanded.

Also, in the spectroscopic camera 1 according to this embodiment, since the noise current applied to the first circuit board 3 with the variable-wavelength interference filter 22 mounted thereat can be eliminated, the operation of the variable-wavelength interference filter 22 can be stabilized. Thus, the wavelength of light outputted from the variable-wavelength interference filter 22 can be stabilized.

In this embodiment, the first connector 71 has the connector shell 711 accommodating the first FG terminal and electrically coupled to the first FG terminal. The casing 6 is electrically coupled to the first FG terminal via the connector shell 711.

Similarly, in this embodiment, the second connector 72 has the connector shell 721 accommodating the second FG terminal and electrically coupled to the second FG terminal. The casing 6 is electrically coupled to the second FG terminal via the connector shell 721.

In such a configuration, the casing 6 and the first FG terminal can be coupled together by a simple structure. Similarly, the casing 6 and the second FG terminal can be coupled together by a simple structure.

The spectroscopic camera 1 according to this embodiment also has the elastic member 8, which is held between the casing 6 and the connector shell 711 and which is electrically conductive at least on the surface thereof. The casing 6 is electrically coupled to the connector shell 711 via the elastic member 8.

In such a configuration, there is no need to provide a wiring for coupling the casing 6 and the first FG terminal together. The casing 6 and the first FG terminal can be coupled together by a simple structure. Also, since the elastic member 8 is held in a pressed state between the casing 6 and the connector shell 711, the casing 6 and the first FG terminal can be securely coupled together.

The spectroscopic camera 1 according to this embodiment also has the plate member 9, which has the one-end part 91 attached to the casing 6 and has the other-end part 92 elastically in contact with the connector shell 721 and which is electrically conductive at least on the surface thereof. The casing 6 is electrically coupled to the connector shell 721 via the plate member 9.

In this embodiment, the connector shell 721 has the connector shell main body 722 accommodating the second FG terminal, and the attachment pieces 723A, 723B protruding from the connector shell main body 722 and attached to the second circuit board 5. The other-end part of the plate member 9 is elastically in contact with the attachment pieces 723A, 723B of the connector shell 721.

In such a configuration, there is no need to provide a wiring for coupling the casing 6 and the second FG terminal together. The casing 6 and the second FG terminal can be coupled together by a simple structure. Also, since the plate member 9 is elastically in contact with the attachment pieces 723A, 723B of the connector shell 721, the casing 6 and the second FG terminal can be securely coupled together.

Modification Examples

The disclosure is not limited to the above embodiment and includes any configuration acquired by a modification, improvement or the like within a range that can achieve the objective of the disclosure.

In the embodiment, the elastic member 8 and the plate member 9 are electrically coupled to the casing 6. If processing to form an insulation layer is performed on the surface of the casing 6, for example, if the surface of the casing 6 is painted with an insulative paint or the like, it is desirable to perform processing to eliminate the insulation layer at the site where the elastic member 8 is in contact with the casing 6 and at the site where the plate member 9 is in contact with the casing 6.

In the embodiment, the first circuit board 3 and the second circuit board 5 may be integrated into one board. In this case, the variable-wavelength interference filter 22 is mounted at one side of the board and the image pickup element 4 is mounted at the other side of the board. The first connector 71 and the second connector 72 may be mounted at any site on the board.

In the embodiment, the elastic member 8 serves as an intermediary in the electrical coupling between the casing 6 and the first connector 71, and the plate member 9 serves as an intermediary in the electrical coupling between the casing 6 and the second connector 72. However, these relationships may be reversed. That is, to determine which intermediary of the elastic member 8 and the plate member 9 should be used for the first connector 71 or the second connector 72, for example, an intermediary that can avoid interference between components may be selected, taking the structure of the first circuit board 3, the second circuit board 5 or the like into account.

In the embodiment, the casing 6 may be electrically coupled to the FG terminal of one of the first connector 71 and the second connector 72, instead of both of these connectors.

In the embodiment, the casing 6 is electrically coupled to the ground of each of the first circuit board 3 and the second circuit board 5. However, these electrical couplings may not be implemented. That is, the effects described in the embodiment can be achieved even when the casing 6 is not electrically coupled to the ground of each of the first circuit board 3 and the second circuit board 5.

In the embodiment, the spectroscopic camera 1 is described as an example. However, the disclosure may also be applied to another electronic apparatus. For example, the disclosure can be suitably applied to an electronic apparatus that needs coupling to an external device during the operation of an electronic component thereof.

In the embodiment, the first connector 71 and the second connector 72 are coupled to the controller 100, which is an external device. However, the disclosure is not limited to this example. That is, the connector in the electronic apparatus to which the disclosure is applied may be coupled to another external device such as a power supply device.

In the embodiment, the first connector 71 and the second connector 72 are receptacle USB terminals. However, the first connector 71 and the second connector 72 may be any other types of connectors having at least a frame ground terminal.

In the first connector 71 in the embodiment, the connector shell 721 is coupled to the first FG terminal. The casing 6 is electrically coupled to the first FG terminal via the connector shell 721. However, the disclosure is not limited to this example. For example, when the connector shell 721 is formed of an insulative resin or the like, the casing 6 may be electrically coupled to the first FG terminal, using a wiring or the like. The same applies to the second connector 72.

OVERVIEW OF DISCLOSURE

An electronic apparatus according to an aspect of the disclosure includes: a circuit board at which an electronic component performing predetermined processing is mounted; a casing accommodating the circuit board; and a connector mounted at the circuit board and provided with a frame ground terminal electrically coupled to an external device. The casing is electrically coupled to the frame ground terminal without going through the circuit board.

In such a configuration, a noise current generated in the casing or the circuit board flows from the casing to a frame ground terminal (FG terminal) of the connector. The noise current then flows to a grounding part of the external device via a frame ground line of a cable coupled to the FG terminal. That is, the noise current generated in the casing or the circuit board flows from the casing to the connector without going through the circuit board and is eliminated by the grounding of the external device. Therefore, the operations of electronic components can be stabilized.

Thus, the electronic apparatus according to this aspect can achieve a sufficient level of immunity as an industrial electronic apparatus. Also, the range of types of electronic components that can be used can be expanded.

In the electronic apparatus according to this aspect, the connector may have a connector shell accommodating the frame ground terminal and electrically coupled to the frame ground terminal. The casing may be electrically coupled to the frame ground terminal via the connector shell.

In such a configuration, the casing and the FG terminal can be coupled together by a simple structure.

The electronic apparatus according to this aspect may further include an elastic member which is held between the casing and the connector shell and which is electrically conductive at least on a surface thereof. The casing may be electrically coupled to the connector shell via the elastic member.

In such a configuration, there is no need to provide a wiring for coupling the casing and the FG terminal together. The casing and the FG terminal can be coupled together by a simple structure. Also, since the elastic member is held in a pressed state between the casing and the connector shell, the casing and the FG terminal can be securely coupled together.

The electronic apparatus according to this aspect may further include a plate member which has a one-end part attached to the casing and has an other-end part elastically in contact with the connector shell and which is electrically conductive at least on a surface thereof. The casing may be electrically coupled to the connector shell via the plate member.

In such a configuration, there is no need to provide a wiring for coupling the casing and the FG terminal together. The casing and the FG terminal can be coupled together by a simple structure.

In the electronic apparatus according to this aspect, the connector shell may have a connector shell main body accommodating the frame ground terminal, and an attachment piece protruding from the connector shell main body and attached to the circuit board. The other-end part of the plate member may be elastically in contact with the attachment piece of the connector shell.

In such a configuration, since the plate member is elastically in contact with the attachment piece of the connector shell, the casing and the FG terminal can be securely coupled together.

In the electronic apparatus according to this aspect, the electronic component may be a spectroscopic element spectrally separating and outputting light having a wavelength corresponding to an inputted drive voltage from incident light. That is, the electronic apparatus according to this aspect may be a spectroscopic camera.

Specifically, the spectroscopic camera according to this aspect includes: a spectroscopic element spectrally separating and outputting light having a predetermined wavelength corresponding to an inputted drive voltage from incident light; an image pickup element picking up an image of the light outputted from the spectroscopic element; a first circuit board having the spectroscopic element mounted thereat; a second circuit board having the image pickup element mounted thereat; a casing accommodating the first circuit board and the second circuit board; a first connector mounted at the first circuit board and provided with a first frame ground terminal electrically coupled to an external device; and a second connector mounted at the second circuit board and provided with a second frame ground terminal electrically coupled to the external device. The casing is electrically coupled to the first frame ground terminal and the second frame ground terminal without going through the first circuit board and the second circuit board, respectively.

In such a configuration, a noise current applied to the first circuit board with the spectroscopic element mounted thereat from the second circuit board with the image pickup element mounted thereat can be eliminated. Therefore, the operation of the spectroscopic element can be stabilized. Thus, the wavelength of light outputted from the spectroscopic element can be stabilized.

What is claimed is:

1. An electronic apparatus, comprising:
   a circuit board at which an electronic component performing predetermined processing is mounted;
   a casing accommodating the circuit board; and
   a connector mounted at the circuit board, wherein
   the connector includes:
     a frame ground terminal electrically coupled to an external device, and
     a connector shell that accommodates the frame ground terminal,
   the connector shell is electrically coupled to the frame ground terminal, and
   the casing is electrically coupled to the frame ground terminal, via the connector shell, without going through the circuit board.

2. The electronic apparatus according to claim 1, further comprising an elastic member which is held between the casing and the connector shell and which is electrically conductive at least on a surface thereof, wherein the casing is electrically coupled to the connector shell via the elastic member.

3. The electronic apparatus according to claim 1, further comprising a plate member which has a one-end part attached to the casing and has an other-end part elastically in contact with the connector shell and which is electrically conductive at least on a surface thereof, wherein the casing is electrically coupled to the connector shell via the plate member.

4. The electronic apparatus according to claim 3, wherein the connector shell includes:
   a connector shell main body accommodating the frame ground terminal; and
   an attachment piece protruding from the connector shell main body and attached to the circuit board, and
   the other-end part of the plate member is elastically in contact with the attachment piece of the connector shell.

5. The electronic apparatus according to claim 1, wherein the electronic component is a variable-wavelength interference filter spectrally separating and outputting light having a wavelength corresponding to an inputted drive voltage from incident light.

6. A spectroscopic camera, comprising:
   a variable-wavelength interference filter spectrally separating and outputting light having a predetermined wavelength corresponding to an inputted drive voltage from incident light;
   an image pickup element picking up an image of the light outputted from the variable-wavelength interference filter;
   a first circuit board having the variable-wavelength interference filter mounted thereat;
   a second circuit board having the image pickup element mounted thereat;
   a casing accommodating the first circuit board and the second circuit board;
   a first connector mounted at the first circuit board and provided with a first frame ground terminal electrically coupled to an external device; and
   a second connector mounted at the second circuit board and provided with a second frame ground terminal electrically coupled to the external device, wherein
   the casing is electrically coupled to the first frame ground terminal and the second frame ground terminal without going through the first circuit board and the second circuit board, respectively.

* * * * *